United States Patent
Dong

(10) Patent No.: US 8,426,280 B2
(45) Date of Patent: Apr. 23, 2013

(54) CHARGE TRAP TYPE NON-VOLATILE MEMORY DEVICE AND METHOD FOR FABRICATING THE SAME

(75) Inventor: Cha-Deok Dong, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 13/448,046

(22) Filed: Apr. 16, 2012

(65) Prior Publication Data

US 2012/0202329 A1 Aug. 9, 2012

Related U.S. Application Data

(62) Division of application No. 12/432,060, filed on Apr. 29, 2009, now Pat. No. 8,178,918.

(30) Foreign Application Priority Data

Jul. 29, 2008 (KR) .................. 10-2008-0074139

(51) Int. Cl.
*H01L 21/336* (2006.01)

(52) U.S. Cl.
USPC .......... 438/287; 257/215; 257/216; 257/321; 257/324; 438/257; 438/591

(58) Field of Classification Search ........ 257/314–317, 257/321, 324; 438/257, 287, 478, 591
See application file for complete search history.

(56) References Cited

U.S. PATENT DOCUMENTS

| 2004/0004243 | A1* | 1/2004 | Rudeck et al. ............... 257/314 |
| 2004/0171236 | A1* | 9/2004 | Shih et al. .................... 438/478 |
| 2007/0246768 | A1  | 10/2007 | Kim et al. |
| 2008/0237685 | A1  | 10/2008 | Cho et al. |

FOREIGN PATENT DOCUMENTS

| KR | 1020060131006 | 12/2006 |
| KR | 100807220 | 2/2008 |
| KR | 1020080030273 | 4/2008 |

OTHER PUBLICATIONS

Korean Office Action for application No. 10-2008-0074139 dated Nov. 12, 2010.
Korean Notice of Allowance for 10-2008-0074139 dated Jul. 28, 2011.

* cited by examiner

*Primary Examiner* — Kimberly Rizkallah
*Assistant Examiner* — Errol Fernandes
(74) *Attorney, Agent, or Firm* — Lowe Hauptman Ham & Berner, LLP

(57) ABSTRACT

There is provided a charge trap type non-volatile memory device and a method for fabricating the same, the charge trap type non-volatile memory device including: a tunnel insulation layer formed over a substrate; a charge trap layer formed over the tunnel insulation layer, the charge trap layer including a charge trap polysilicon thin layer and a charge trap nitride-based layer; a charge barrier layer formed over the charge trap layer; a gate electrode formed over the charge barrier layer; and an oxide-based spacer formed over sidewalls of the charge trap layer and provided to isolate the charge trap layer.

6 Claims, 5 Drawing Sheets

CHARGE TRAP TYPE NON-VOLATILE MEMORY DEVICE AND METHOD FOR FABRICATING THE SAME

CROSS-REFERENCE TO RELATED APPLICATIONS

The present application is a Divisional of patent application Ser. No. 12/432,060, filed on Apr. 29, 2009, which claims priority from Korean patent application number 10-2008-0074139, filed on Jul. 29, 2008, and the disclosure of which is hereby incorporated by reference herein its entirety.

BACKGROUND

The present disclosure relates to a semiconductor device and a method for fabricating the same, and more particularly, to a charge trap type non-volatile memory device and a method for fabricating the same.

A non-volatile memory device refers to a memory device which can maintain stored data intact even when a power supply is cut off. In particular, a memory device which stores data by storing or erasing charges in a floating gate is referred to as a floating gate type non-volatile memory device.

A typical floating gate type non-volatile memory device includes a tunnel insulation layer, a floating gate, a charge barrier layer, and a control gate formed over a substrate. A typical floating gate type non-volatile memory device stores data by injecting or emitting charges in the floating gate.

However, there is a limitation as to achieving a large integration scale in a floating gate type non-volatile memory device because as the thickness of a tunnel insulation layer becomes greater, a higher operation voltage may be needed, causing its peripheral circuitry to become complicated.

Therefore, a typical method presents a charge trap type non-volatile memory device as a type of non-volatile memory device. Herein, a charge trap type non-volatile memory device is described in detail with a drawing.

FIG. 1 illustrates a cross-sectional view of a typical charge trap type non-volatile memory device. The charge trap type non-volatile memory device includes a tunnel insulation layer 110, a charge trap layer 120, a charge barrier layer 130, a gate electrode 140, and a hard mask pattern 150 formed over a substrate 100.

The tunnel insulation layer 110 is formed as an energy barrier layer for charge tunneling. The tunnel insulation layer 110 may include an oxide-based layer.

The charge trap layer 120 stores charges which tunneled through the tunnel insulation layer 110. Thus, the charge trap layer 120 substantially functions as a data storing unit. The charge trap layer 120 may include a nitride-based layer.

The charge barrier layer 130 is formed to prevent charges from passing through the charge trap layer 120 and moving upward.

At this time, nitride-based spacers 160 are formed over sidewalls of the hard mask pattern 150 and the gate electrode 140 to prevent oxidation of the gate electrode 140 during a subsequent process.

Reference denotation 'A' represents a charge trap structure A which includes the tunnel insulation layer 110, the charge trap layer 120, the charge barrier layer 130, the gate electrode 140, the hard mask pattern 150, and the nitride-based spacers 160. An oxide-based spacer 170 is formed over the charge trap structure A.

The typical charge trap type non-volatile memory device having the above described structure stores or erases charges in a deep level trap site in the charge trap layer 120. Thus, the stored charges may not be lost even when the tunnel insulation layer 110 is formed to a small thickness. Also, the typical charge trap type non-volatile memory device may be operated at a low operation voltage. Furthermore, the integration scale of a semiconductor device may be improved compared to a floating gate type non-volatile memory device.

However, the typical charge trap type non-volatile memory device may have limitations as follows. For the charge trap layer 120 including a nitride-based layer, there may be a large density difference in a trap site depending on the composition of silicon (Si) and nitrogen (N) of the nitride-based layer. Thus, charges stored in the charge trap layer 120 may not be dispersed evenly.

In particular, storage and erasure of charges may not be performed smoothly because the trap site is concentrated on an interface between the charge barrier layer 130 and the charge trap layer 120 and the interface state is unstable. Such limitation may deteriorate data retention and endurance of the memory device.

Furthermore, sidewalls of the tunnel insulation layer 110 and the charge trap layer 120 are not protected by the nitride-based spacers 160. Therefore, the sidewalls of the tunnel insulation layer 110 and the charge trap layer 120 may be exposed and damaged during a subsequent process.

In the typical method, an oxidation process is performed on the substrate structure including the charge trap structure A to form the oxide-based spacer 170. The oxide-based spacer 170 is formed so that the tunnel insulation layer 110 and the charge trap layer 120 may be reinforced and prevented from getting damaged.

However, there are limitations as to preventing damage by forming the oxide-based spacer 170 on the sidewalls of the layers that constitute the charge trap structure A due to structural characteristics of the charge trap structure A configured in a multiple-layer stack structure. As a result, damage in the charge trap layer 120 may induce loss of data stored in the memory device, i.e., charges, and thus, deteriorate data retention of the memory device.

On the other hand, if the oxidation process is performed for a longer period of time in order to sufficiently reinforce the damaged sidewalls, there may arise other limitations such as oxidation of the substrate 100 or change in the impurity concentration level and depth in source/drain regions.

Furthermore, charges may be lost through a portion of the sidewall of the charge trap layer 120, as represented with reference denotation 'B', because an interface between the charge trap layer 120 and the oxide-based spacer 170 is not stabilized even after the oxide-based spacer 170 is formed over the sidewalls of the charge trap layer 120.

SUMMARY

One or more embodiments disclosed in the present application are directed to providing a memory device having a charge trap layer which includes a polysilicon thin layer and a nitride-based layer and a method for fabricating the same.

In accordance with one or more embodiments, there is provided a charge trap type non-volatile memory device, including: a tunnel insulation layer formed over a substrate; a charge trap layer formed over the tunnel insulation layer, the charge trap layer including a charge trap polysilicon thin layer and a charge trap nitride-based layer; a charge barrier layer formed over the charge trap layer; a gate electrode formed over the charge barrier layer; and an oxide-based spacer formed over sidewalls of the charge trap layer and provided to isolate the charge trap layer.

In accordance with one or more embodiments, there is provided a method for fabricating a charge trap type non-volatile memory device, including: forming a tunnel insulation layer over a substrate; forming a charge trap layer over the tunnel insulation layer, the charge trap layer including a charge trap polysilicon thin layer and a charge trap nitride-based layer; forming a charge barrier layer over the charge trap layer; forming a gate electrode conductive layer over the charge barrier layer; etching the gate electrode conductive layer, the charge barrier layer, the charge trap layer, and the tunnel insulation layer to form a charge trap structure; and forming an oxide-based spacer over sidewalls of the etched charge trap layer.

DESCRIPTION OF EMBODIMENTS

Figure 1:
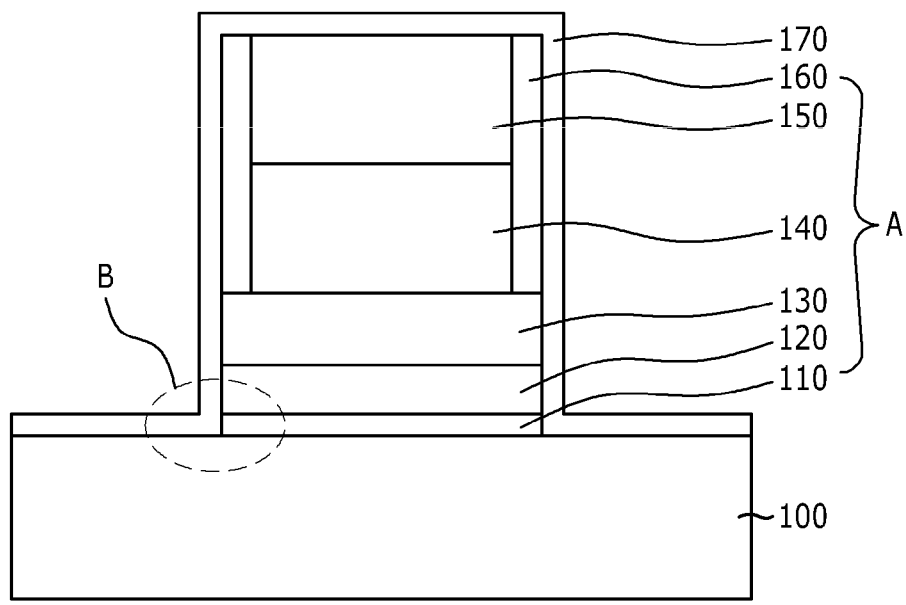
FIG. 1 illustrates a cross-sectional view of a typical charge trap type non-volatile memory device.

Other objects and advantages of the present disclosure can be understood by the following description, and will become apparent with reference to one or more embodiments.

One or more embodiments of the present disclosure relate to a charge trap type non-volatile memory device which includes a charge trap layer having a polysilicon thin layer and a nitride-based layer. The charge trap type non-volatile memory device may improve the operation rate of charge storage and erasure by dispersedly storing charges in the polysilicon thin layer and the nitride-based layer. Furthermore, the charge trap type non-volatile memory device may prevent loss of charges by effectively isolating the charge trap layer using an oxide-based layer formed to enclose sidewalls of the charge trap layer. Therefore, data retention and reliability of the memory device may be enhanced.

Hereafter, one or more of various embodiments of the present disclosure will be described in detail. Regarding the drawings, the illustrated thickness and spacing distance may be exaggerated for convenience. In the description of the present invention, any portions irrelevant to the substance of the present disclosure may be omitted. Furthermore, the same or like reference numerals through out the various embodiments of the present invention represent the same or like elements in different drawings. It will be understood that when a layer is referred to as being "on/under" another layer or substrate, it can be directly on/under the other layer or substrate, or intervening layers may also be present. In addition, when a layer is referred to as being 'between' two layers, it can be the only layer between the two layers, or one or more intervening layers may also be present.

FIGS. 2A to 2G show cross-sectional views illustrating a method of fabricating a charge trap type non-volatile memory device in accordance with one embodiment.

Figure 2A:
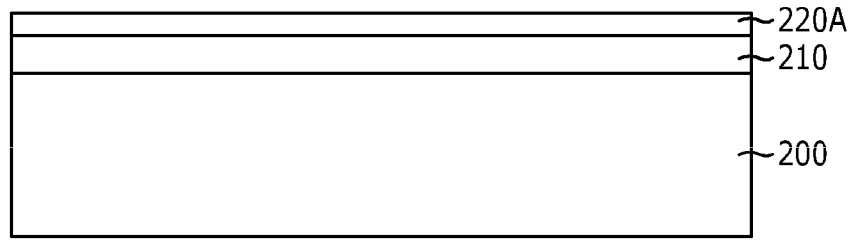
FIGS. 2A to 2G show cross-sectional views illustrating a method of fabricating a charge trap type non-volatile memory device in accordance with one embodiment.

Referring to FIG. 2A, a tunnel insulation layer 210 is formed over a substrate 200. The tunnel insulation layer 210 is formed as an energy barrier layer for charge tunneling. The tunnel insulation layer 210 may include an oxide-based layer formed by a radical oxidation process.

The radical oxidation process may be performed at a temperature ranging from approximately 750° C. to approximately 950° C. The occurrence of undesirable formation in the tunnel insulation layer 210 may be minimized by including nitrogen during the oxidation process. For instance, the tunnel insulation layer 210 may be formed to a thickness ranging from approximately 40 Å to approximately 60 Å. Also, an annealing process may be performed using nitrous oxide ($N_2O$) gas or nitrogen oxide (NO) gas.

A charge trap polysilicon thin layer 220A is formed over the tunnel insulation layer 210. For instance, the charge trap polysilicon thin layer 220A may be formed to a thickness ranging from approximately 10 Å to approximately 30 Å. However, if it is difficult to form the charge trap polysilicon thin layer 220A to the above described thickness due to limitations arising during the process, the charge trap polysilicon thin layer 220A may be formed using the process shown below.

An amorphous silicon layer is formed to a certain thickness over the tunnel insulation layer 210. For instance, the amorphous silicon layer may be formed to a thickness ranging from approximately 50 Å to approximately 100 Å.

The amorphous silicon layer may be formed at a temperature ranging from approximately 480° C. to approximately 550° C. using silane ($SiH_4$) gas or disilane ($Si_2H_6$) gas in a high-temperature low-pressure batch type furnace.

Otherwise, an amorphous silicon layer, not doped with impurities, may be formed using a single wafer type chamber, or an amorphous silicon layer, doped with impurities, may be formed using phosphine ($PH_3$) gas. At this time, the rate of charge storage and erasure of the memory device may be controlled by controlling the impurity doping concentration level.

The amorphous silicon layer is crystallized and oxidized using an oxidation process. The amorphous silicon layer is crystallized to form a polysilicon layer and, at substantially the same time, oxidized to form an oxide layer. An upper portion is oxidized without oxidizing a bottom portion by controlling the oxidation process. As a result, a thin layer structure which includes the non-oxidized remaining polysilicon thin layer in the bottom portion and the oxide layer in the upper portion may be formed.

Therefore, it may be possible to form an oxide layer having a uniform thickness by performing an oxidation process to crystallize and form the oxide layer at substantially the same time, and thus forming a remaining polysilicon thin layer with a uniform thickness. For instance, the remaining polysilicon thin layer may be formed to a thickness ranging from approximately 10 Å to approximately 30 Å.

The oxidation process of the amorphous silicon layer may be performed at a temperature ranging from approximately 700° C. to approximately 1,000° C. using a high-temperature low-pressure oxidation method. Also, the oxidation process may be performed using a wet, dry, or radical oxidation method.

A wet etch process is performed to remove the oxide layer using the remaining polysilicon thin layer as an etch stop layer. For instance, the wet etch process may be performed using hydrogen fluoride (HF) or buffer oxide etchant (BOE), and thus, the remaining polysilicon thin layer may be formed to have a thickness ranging from approximately 10 Å to approximately 30 Å over the tunnel insulation layer 210. Consequently, the charge trap polysilicon thin layer 220A having a uniform thickness is formed.

Figure 2B:
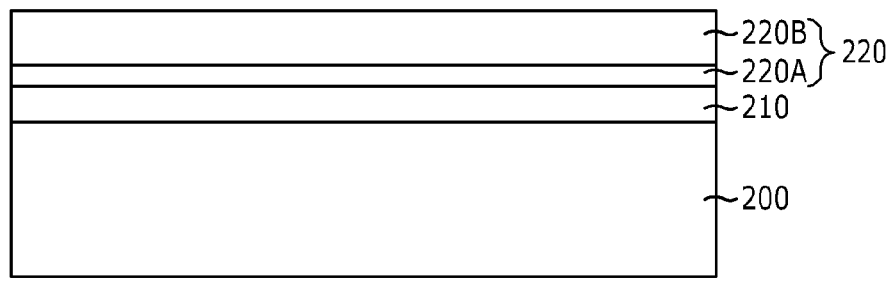

Referring to FIG. 2B, a charge trap nitride-based layer 220B is formed over the charge trap polysilicon thin layer 220A. Thus, a charge trap layer 220 including the charge trap polysilicon thin layer 220A and the charge trap nitride-based layer 220B is formed.

For instance, the charge trap nitride-based layer 220B may be formed using a low pressure chemical vapor deposition (LPCVD) method or a plasma enhanced chemical vapor deposition (PECVD) method at a temperature ranging from approximately 300° C. to approximately 650° C.

At this time, the charge trap nitride-based layer 220B may be formed to have a ratio of silicon (Si) to nitrogen (N) ranging approximately 1:1.30-1.36 and a thickness ranging from approximately 30 Å to approximately 70 Å. At this time, the process may be controlled in a manner that an interfacial oxide layer is not formed between the charge trap nitride-based layer 220B and the charge trap polysilicon thin layer 220A.

Figure 3:
FIG. 3 illustrates details of a charge trap nitride-based layer of FIG. 2B.

Furthermore, referring to FIG. 3 along with FIG. 2B, the charge trap nitride-based layer 220B may include a stack structure which includes a first nitride-based layer (220B1) and a second nitride-based layer (220B2), wherein the second nitride-based layer (220B2) has a different nitrogen ratio from that of the first nitride-based layer (220B1). For instance, the first nitride-based layer (200B1) may be formed over charge trap polysilicon thin layer 220A, and the second nitride-based layer (220B2) having a higher nitrogen content than the first nitride-based layer (220B1) may be formed over the first nitride-based layer (220B1). As a result, charges stored in the charge trap layer 220 may be prevented from leaking out and thus the functions of a subsequent charge barrier layer may be supplemented. For instance, the second nitride-based layer may be formed to have a ratio of Si to N ranging approximately 1:1.33-2.0 and a thickness ranging from approximately 10 Å to approximately 30 Å.

The charge trap type non-volatile memory device in accordance with one or more embodiments dispersedly stores charges in the charge trap polysilicon thin layer 220A and the charge trap nitride-based layer 220B as described above. As a result, the charge trap type non-volatile memory device may stably store and erase charges compared to a typical method. Furthermore, the rate of charge storage and erasure may be improved in the charge trap type non-volatile memory device in accordance with one or more embodiments.

Figure 2C:
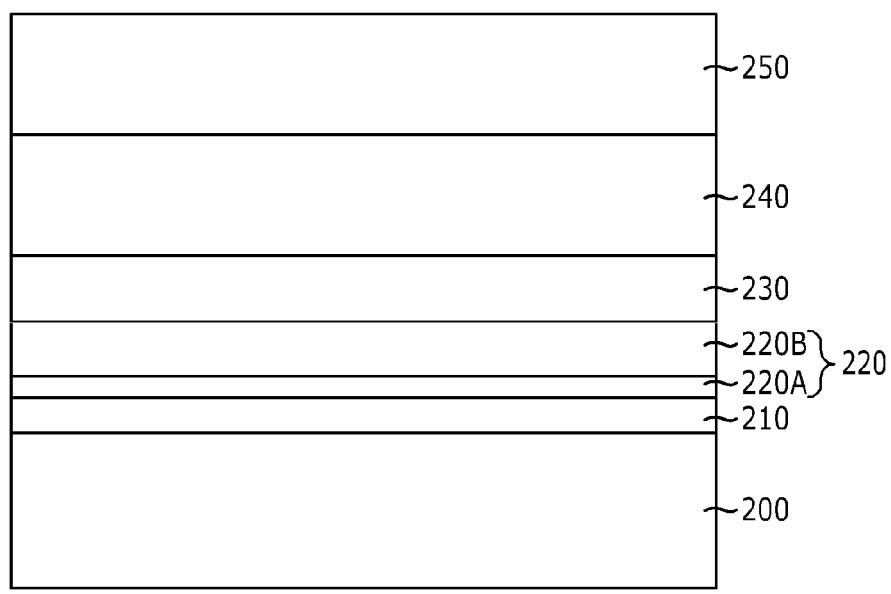

Referring to FIG. 2C, a charge barrier layer 230 is formed over the charge trap layer 220. The charge barrier layer 230 is a type of barrier layer which is formed to prevent charges from passing through the charge trap layer 220 and moving upward. For instance, the charge barrier layer 230 may include a high-k dielectric layer formed to a thickness ranging from approximately 50 Å to approximately 250 Å, wherein k stands for a constant.

In particular, the charge barrier layer 230 may include a stack structure which includes one of LaHfO, DyScO and HfAlO compounds and an aluminum oxide ($Al_2O_3$) layer. Also, the charge barrier layer 230 may be formed using an atomic layer deposition (ALD) method, chemical vapor deposition (CVD) method, or plasma vapor deposition (PVD) method.

A thermal treatment process is performed on the substrate structure to crystallize or induce phase change in the charge barrier layer 230. As a result, the dielectric constant of the charge barrier layer 230 may be increased and the charge barrier layer 230 may be further densified. The thermal treatment process may be performed at a temperature ranging from approximately 800° C. to approximately 1,100° C. in a nitrogen ($N_2$) gas ambience or a mixture of $N_2$ gas and oxygen ($O_2$) gas ambience.

A gate electrode conductive layer 240 is formed over the charge barrier layer 230. For instance, the gate electrode conductive layer 240 may include a stack structure of metal and polysilicon. In particular, the gate electrode conductive layer 240 may be formed by forming a tantalum (Ta)-based or titanium (Ti)-based metal, e.g., titanium nitride (TiN), tantalum nitride (TaN), tantalum carbide nitride (TaCN), oxidized tantalum carbonitride (TaCNO), Ti/TiN, Ti/TaN or tantalum-carbide (TaC), and a polysilicon layer doped with N-type impurities, e.g., phosphorus (P). For instance, the polysilicon layer may be doped at a concentration level ranging from approximately $3 \times 10^{20}$ atoms/cc to approximately $1 \times 10^{21}$ atoms/cc to form an N-type gate electrode.

Tungsten silicide (WSix) may be additionally formed over the polysilicon layer or a combination of tungsten (W) and tungsten nitride (WNx) may be additionally formed over the polysilicon layer to improve resistance of a subsequent gate electrode.

A hard mask layer 250 is formed over the gate electrode conductive layer 240. For instance, the hard mask layer 250 may include silicon oxynitride (SiON) or silicon nitride (SiN).

Figure 2D:
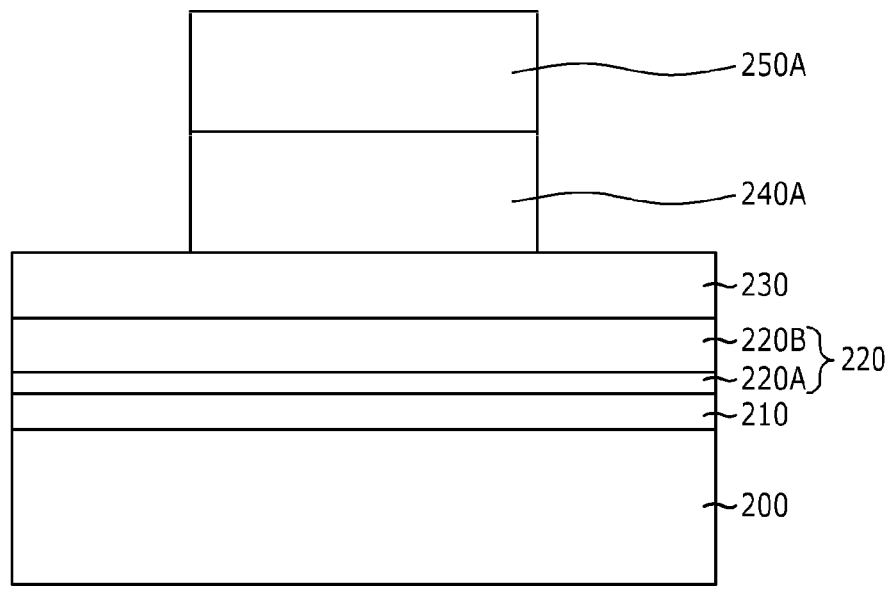

Referring to FIG. 2D, a photoresist pattern (not shown) is formed over the hard mask layer 250 to form a gate electrode. The hard mask layer 250 and the gate electrode conductive layer 240 are etched using the photoresist pattern to form a hard mask pattern 250A and a gate electrode 240A.

Figure 2E:
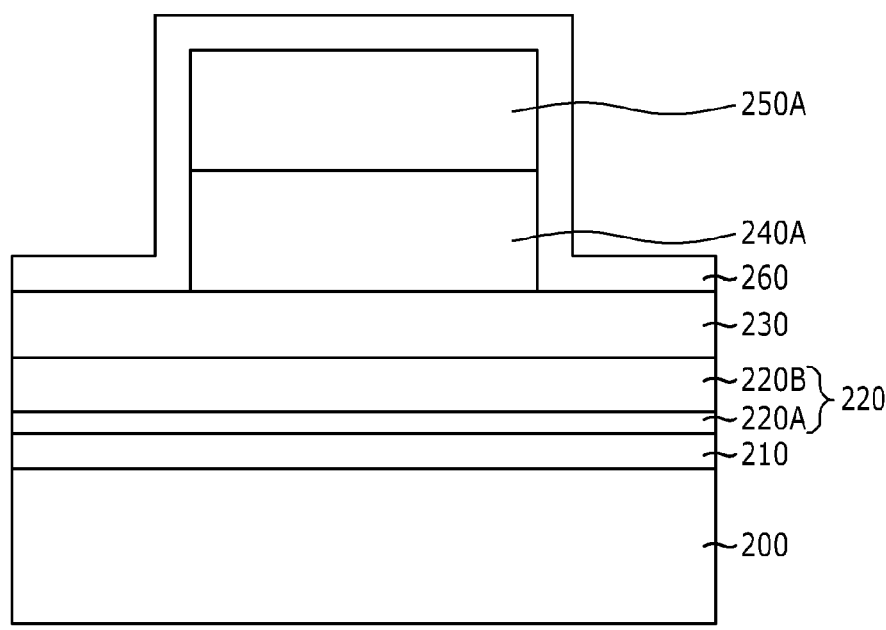

Referring to FIG. 2E, a spacer insulation layer 260 is formed over the substrate structure to prevent abnormal oxidation of the gate electrode 240A during a subsequent oxidation process. For instance, the spacer insulation layer 260 may include a nitride-based layer formed to a thickness ranging from approximately 50 Å to approximately 100 Å using a CVD method.

Figure 2F:
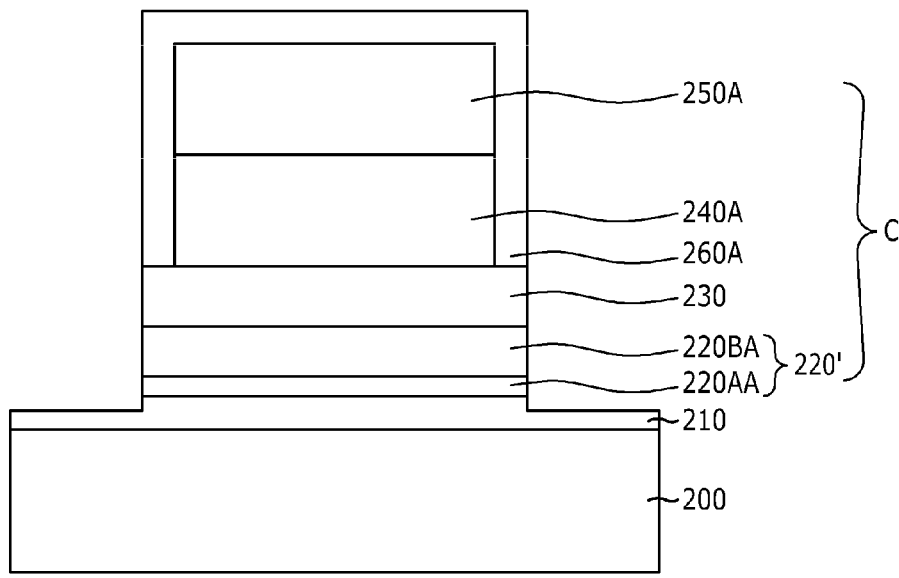

Referring to FIG. 2F, a spacer etch is performed on the spacer insulation layer 260 (FIG. 2E) to form a spacer 260A over sidewalls of the hard mask pattern 250A and the gate electrode 240A. The charge barrier layer 230, the charge trap layer 220, and the tunnel insulation layer 210 are etched using the hard mask pattern 250A and the spacer 260A as an etch barrier to form a charge barrier pattern 230A, a first charge trap pattern 220', and an etched tunnel insulation layer 210A. Reference denotations 220AA and 220BA represent a charge trap polysilicon thin pattern 220AA and a charge trap nitride-based pattern 220BA, respectively. Thus, a charge trap structure C is formed.

The etch process is performed in a manner that the etched tunnel insulation layer 210A remains with a thickness ranging from approximately 10 Å to approximately 30 Å. As a result, damage on the substrate 200 may be minimized and an undercut problem, where the tunnel insulation layer 210 around the charge trap structure C is excessively etched, may be prevented.

Figure 2G:
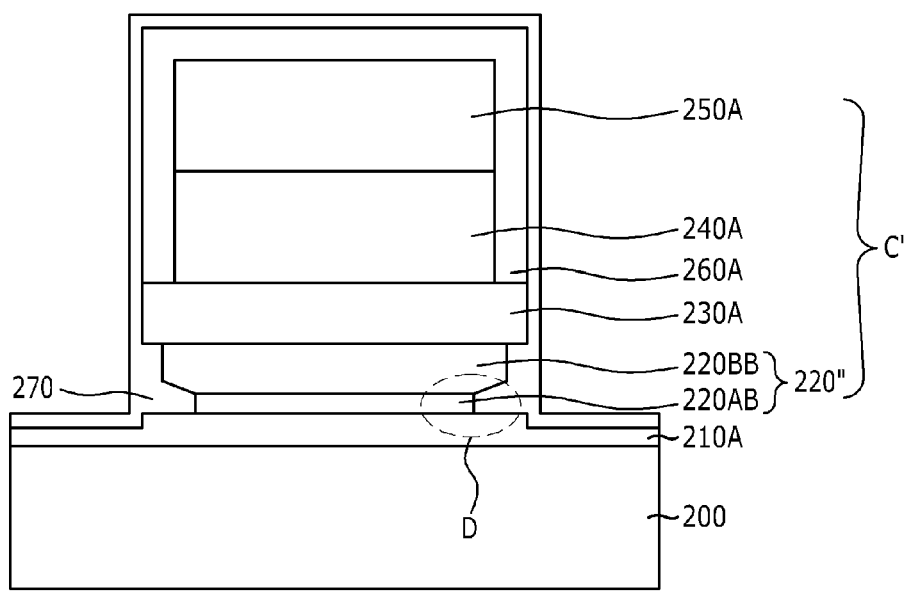

Referring to FIG. 2G, an oxidation process is performed on the substrate structure to oxidize edge portions of the first charge trap pattern 220' and form an oxide-based spacer 270 over the substrate structure. Reference denotation 220" represents a second charge trap pattern 220".

The oxide-based spacer 270 is formed in a bird's beak shape as shown with reference denotation 'D'. The oxide-based spacer 270 is formed in a manner to enclose sidewalls of the second charge trap pattern 220" and thus isolating the second charge trap pattern 220". Reference denotations 220AB and 220BB represent an oxidized charge trap polysilicon thin pattern 220AB and an oxidized charge trap nitride-based pattern 220BB, respectively.

Formation of the bird's beak shape of the oxide-based spacer 270 may be achieved because the charge trap polysilicon thin pattern 220AA is more easily oxidized than other layers. In other words, during the oxidation process, oxidation starts from edge portions of the charge trap polysilicon thin pattern 220AA and forms the bird's beak shaped oxide-based spacer 270 developing into the charge trap polysilicon thin pattern 220AA, thus forming the oxidized charge trap polysilicon thin pattern 220AB.

In particular, the oxide-based spacer 270 formed over edge portions of the oxidized charge trap polysilicon thin pattern 220AB accelerates oxidation of sidewalls of the charge trap nitride-based pattern 220BA to form the oxidized charge trap nitride-based pattern 220BB.

Therefore, the thickness of the oxide-based spacer 270 enclosing the sidewalls of the second charge trap pattern 220" becomes greater than that of the typical method. Consequently, loss of stored charges may be prevented by substantially isolating the second charge trap pattern 220". Reference denotation C' represents an oxidized charge trap structure C'.

For instance, the oxidation process may be performed using a radical oxidation method at a temperature ranging from approximately 700° C. to approximately 950° C. so that all layers including Si may be oxidized. Also, the oxide-based spacer 270 may be formed to a thickness ranging from approximately 10 Å to approximately 30 Å. As a result, oxidation of the substrate 200 may be minimized, and changes in impurity concentration levels and the depths of source/drain regions may be minimized.

Although not illustrated, an additional oxide-based layer may be formed using a CVD method after forming the oxide-based spacer 270 using the oxidation process.

While one or more embodiments have been described, it will be apparent to those skilled in the art that various changes and modifications may be made without departing from the spirit and scope defined in the following claims.

What is claimed is:

1. A method of fabricating a charge trap type non-volatile memory device, comprising:
    forming a tunnel insulation layer over a substrate;
    forming a charge trap layer over the tunnel insulation layer, the charge trap layer including a charge trap polysilicon thin layer and a charge trap nitride-based layer;
    forming a charge barrier layer over the charge trap layer;
    forming a gate electrode conductive layer over the charge barrier layer;
    etching the gate electrode conductive layer, the charge barrier layer, the charge trap layer, and the tunnel insulation layer to form a charge trap structure; and
    forming an oxide-based spacer over sidewalls of the etched charge trap layer using an oxidation process so that the charge trap polysilicon thin layer has a recess portion and the oxide-based spacer extends inwardly to the recess portion of the charge trap polysilicon thin layer, wherein a lower surface of the charge trap nitride-based layer exposed by the recess portion slopes towards the charge trap polysilicon thin layer.

2. The method of claim 1, wherein forming the charge trap polysilicon thin layer comprises:
    forming an amorphous silicon layer over the tunnel insulation layer;
    crystallizing and oxidizing the amorphous silicon layer using an oxidation process; and
    removing an oxide-based layer formed after performing the oxidation process to form the charge trap polysilicon thin layer having a uniform thickness.

3. The method of claim 2, wherein the oxidizing the amorphous silicon layer comprises performing one of a wet oxidation method, a dry oxidation method, and a radical oxidation method.

4. The method of claim 1, wherein forming the charge trap nitride-based layer comprises:
    forming a first nitride-based layer over the charge trap polysilicon thin layer; and
    forming a second nitride-based layer over the first nitride-based layer, the second nitride-based layer having a higher nitrogen content than the first nitride-based layer.

5. The method of claim 1, wherein forming the charge trap structure comprises:
    etching the gate electrode conductive layer to form a gate electrode;
    forming a nitride-based spacer over sidewalls of the gate electrode;
    etching the charge barrier layer, the charge trap layer, and the tunnel insulation layer using the nitride-based spacer,
    wherein the tunnel insulation layer is etched in a manner that a portion of the tunnel insulation layer remains over the substrate; and
    performing an oxidation process over the substrate structure to form an oxide-based spacer over sidewalls of the etched charge trap layer.

6. The method of claim 5, wherein the performing the oxidation process comprises using a radical oxidation method.

* * * * *